United States Patent [19]

Sharpe

[11] Patent Number: 4,560,963
[45] Date of Patent: Dec. 24, 1985

[54] ANALOG RC ACTIVE FILTER

[75] Inventor: Robin Sharpe, Carshalton, England

[73] Assignee: U.S. Philips Corporation, New York, N.Y.

[21] Appl. No.: 579,830

[22] Filed: Feb. 13, 1984

[30] Foreign Application Priority Data

Feb. 22, 1983 [GB] United Kingdom ................ 8304891

[51] Int. Cl.[4] ...................... H03H 11/08; H03H 7/06
[52] U.S. Cl. .................................. 333/172; 330/109;
330/294; 330/302; 333/167; 357/51
[58] Field of Search ............... 333/167, 172, 185, 246;
330/53, 106, 109, 265, 294, 302, 303, 307;
357/51; 328/167

[56] References Cited

U.S. PATENT DOCUMENTS

| 3,564,441 | 2/1971 | Eide .................................. 330/302 |
| 3,569,872 | 3/1971 | Berlin ................................ 333/172 |
| 3,605,032 | 9/1971 | Kerwin ......................... 330/109 X |
| 4,302,737 | 11/1981 | Kausche et al. .................... 333/172 |
| 4,399,417 | 8/1983 | Ballantyne et al. ............. 333/172 X |

OTHER PUBLICATIONS

Hanneman—"Higher-Order RC-Active Filters", Philips Res. Repts 26(R752), 1971; pp. 65–74.
Leppävuori et al.—"Thick Film Distributed RC-Networks for Practical Use", Conference Proc. of the 29th Electronic Components Conference, Cherry Hill, N.J., USA (May 14–16, 1979); pp. 402–406.
Glasford—"Design Aspects and Performance Limitations of Amplifier Isolated Active R-C Filters", Conference Record of the Twelfth Asilomar Conference on Circuits, Systems and Computers, Pacific Grove, CA, USA (Nov. 6–8, 1978); pp. 44–48.

Primary Examiner—Marvin L. Nussbaum
Attorney, Agent, or Firm—Robert T. Mayer; Steven R. Biren

[57] ABSTRACT

An RC active filter device which is implemented with integrated circuit technology. Each RC filter element of the device has a distributed series resistance and a distributed shunt capacitance. The series resistance is formed by a strip of resistive material which overlies a resistive plate (or substrate) with an intervening insulating layer to form the shunt capacitance. The filter device can be designed to have a pass-band ripple response which is not affected by variation in nominal absolute resistance and capacitance values resulting from process spreads. These variations only stretch or compress the filter response along the frequency axis. The filter device comprises three RC filter elements and an operational amplifier. The RC filter elements nearest the operational amplifier determine a low pass band, while the input filter element prevents high frequency components outside the low pass band being leaked directly to the filter device output.

5 Claims, 11 Drawing Figures

ANALOG RC ACTIVE FILTER

BACKGROUND OF THE INVENTION

This invention relates to analog wave filter devices of a type comprising an active device and first and second RC filter elements each providing a series resistance and a shunt capacitance, each filter element having first and second connection points between which its series resistance is defined and a third connection point for the shunt capacitance, the first connection point of the first filter element serving as an input of the filter device, the second connection point of the first filter element being connected to the first connection point of the second filter element, the second connection point of the second filter element being connected to an input of the active device, the third connection point of the first filter element being connected to an output of the active device, and the third connection point of the second filter element being connected to ground.

An analog wave filter device of the above type is known from the article in *Electronics,* Apr. 10, 1959, at pages 68–70. In the device described in this article the active device is a cathode follower and each filter element is composed of a descrete resistor and a discrete capacitor. It is also known from British patent specification No. 1 211 574 that in a filter device of the above type the RC filter elements can be formed by distributed resistance/capacitance components.

The present invention is concerned with the implementation of a low pass RC active filter device of the type set forth above using integrated circuit technology. The filter device to be implemented is required to serve as an anti-alias pre-filter having a low pass band corresponding to a frequency band of interest for accepting a baseband signal which is to be applied to a switched-capacitor filter device. Such an anti-alias pre-filter is required to reject noise signals of frequency above the low pass band to which the switched-capacitor filter device would otherwise respond to produce spurious output signals that "alias" bone fide output signals as produced by the switched-capacitor filter device in response to the baseband signal.

There has been recent activity in the development of RC active filter devices using integrated circuit technologies, such as MOS integrated circuit technology. Examples of this activity are given in U.K. Patent Application GB No. 2 077 469 A and European Patent Application No. 0 013 173. In each of these Applications, RC active filter devices are described having integrated operational amplifiers as active devices and integrated resistance/capacitance filter elements which are in distributed form.

The present invention proposes an integrated low pass RC active filter device of the type set forth above in which the first and second RC filter elements are in distributed form. As will be explained later in the specification, it is advantageous, particularly when using MOS integrated circuit technology, to implement these RC filter elements in this way. However, it has been found with this implementation that high frequency components in an input signal applied to the input of the filter device tend to leak directly to the output. This undesirable feedthrough effect increases with increase in frequency.

The present invention also proposes an integrated low pass RC active filter device of the type set forth above in which the active device is an operational amplifier, that is a differential amplifier with high gain and external feedback for gain-bandwidth control. Ideally, the operational amplifier should have infinite input impedance and zero output impedance, but in practice these input and ouput impedances have significant finite values, particularly when using MOS integrated circuit technology. For input signals of frequency in the low pass band, the gain-bandwidth control afforded by the external feedback maintains the amplifier output impedance at a suitably low value. However, outside the pass band the amplifier has a nonlinear behavior in that its gain rolls off with increasing frequency so that the feedback action becomes less effective and the amplifier output impedance increases. This results in an increased tendency for high frequency input components to be fed through to the filter device output.

The cumulative result of the two high frequency effects discussed above is that the filter device attenuation is progressively reduced outside the required pass band with increase in input signal frequency, once these high frequency effects start to occur. Thus, the use of the filter device as an anti-alias pre-filter as mentioned previously poses a problem if high frequency noise signals cannot be adequately attentuated by the filter device.

SUMMARY OF THE INVENTION

It is an object of the present invention to provide a filter device of the type set forth above in which this cumulative result is avoided.

According to the invention, a filter device of the type set forth above having an integrated operational amplifier as its active device and having its first and second RC filter elements in integrated distributed form, is characterized by comprising a third RC filter element which is on the same distributed form as the first and second filter elements and which has its second connection point connected to the first connection point of the first filter element and its third connection point connected to ground, the first connection point of the third filter element now serving as the input of the filter device. The effect of the third filter element is to divert to ground high frequency components in the input signal, so that these components are no longer fed through directly to the output of the filter device.

BRIEF DESCRIPTION OF THE DRAWING

In further considering the nature of the invention, reference will now be made by way in example to the accompanying drawings, of which.

DESCRIPTION OF THE PREFERRED EMBODIMENTS

Figure 1:
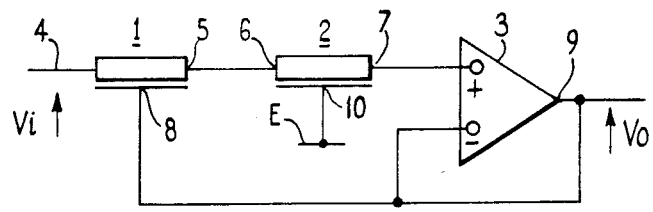
FIG. 1 shows diagrammatically a known form of an RC active filter device.

Referring to the drawings, the RC active filter device shown in FIG. 1 is a low band pass filter comprising two distributed RC filter elements 1 and 2 and a differential amplifier 3. The filter element 1 has a first connection 4 which serves as an input of the filter device, and a second connection 5 which is connected to a first connection 6 of the filter element 2. A second connection 7 of the filter element 2 is connected to a non-inverting input (+) of the differential amplifier 3. A third connection 8 of the first filter element 1 is connected to an inverting input (−) and to an output 9 of the differential amplifier 3, which output 9 also serves as an output of the filter device. A third connection 10 of the second filter element 2 is connected to ground (E).

In response to an input signal voltage Vi applied to the input connection 4, the RC active filter device produces an output signal voltage Vo in dependence on its transfer function which is equal to Vo/Vi. As will be described, this transfer function can be considered to be determined only by the hyperbolic cosine (cosh) of the distributed time constant ($\tau$=RC) of each of the filter elements 1 and 2.

Figure 2:
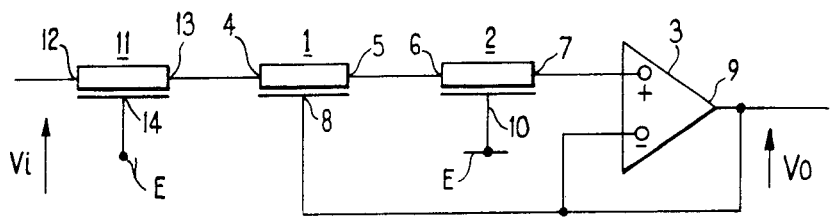
FIG. 2 shows diagrammatically an embodiment of an RC active filter device according to the invention.

The present invention arises from the problem discussed previously, that with an RC active filter device of the construction shown in FIG. 1, high frequency components, in an input signal applied to the input connection 4, that are outside the pass band of the filter device can leak directly to the output 9 through the first filter element 1 due to non-linear behavior of the amplifier 3. FIG. 2 shows in accordance with the invention a modified construction of RC active filter device in which such leakage of high frequency components does not occur to any significant extent. The modified filter device shown in FIG. 2 differs from the filter device shown in FIG. 1 by the addition of a third distributed RC filter element 11. A first connection 12 of this third filter element 11 serves as the input for the modified filter device. A second connection 13 of the third filter element 11 is connected to the first connection 4 of the filter element 1, and a third connection 14 thereof is connected to ground (E).

Because the present invention only has relevance for an RC filter device with distributed RC filter elements and when this filter device is implemented using integrated circuit technology, theoretical concepts underlying the implementation of the filter device will be considered in some detail hereinafter.

In integrated circuit technology, for instance MOS integrated circuit technology, a resistance element can be fabricated as a strip of polysilicon. The total resistance $R_{tot}$ of the resistance element is given by the equation $R_{tot}=k_r l/d$, where $k_r$ is the resistivity per unit square of the polysilicon, l is the length of the strip, and d is the width of the strip. Also, a capacitance element can be fabricated as two spaced-apart areas of polysilicon. The total capacitance $C_{tot}$ of the capacitance element is given by the equation $C_{tot}=k_c ld$, where $k_c$ is the capacitance per unit area of the spaced-apart areas, and l and d are, respectively, the length and the width of the areas. An RC filter element, can then be formed by combining these resistance and capacitance elements.

However, when forming such an RC filter element its actual R and C values can vary considerably from desired values, because both $k_r$ and $k_c$ are process dependent. For instance, in MOS integrated circuit technology, it has been found that $k_c$ can vary by ±15% from an intended value and $k_r$ can vary by ±40% from an intended value due to spreads in the different process stages. Therefore, it has hitherto been expected that a filter device embodying such RC filter elements will have a significant spread not only in its frequency response characteristic for a given pass band, but also in its ripple response within the pass band. By using distributed RC filter elements in a suitable RC active filter device, so that factors which govern the distribution of parameters along a transmission line are simulated in the filter elements, and by having a strip of resistive material of the same width in each filter element, a designed maximum ripple response for the filter device will remain substantially unaltered regardless of variation, within practical limits, of absolute resistance and capacitance values of the RC filter elements thereof. The effect of such variation is therefore limited to stretching or compressing the filter response along the frequency axis only. Thus, process tolerances which occur in fabrication of the distributed RC filter elements can become acceptable.

Figure 3:
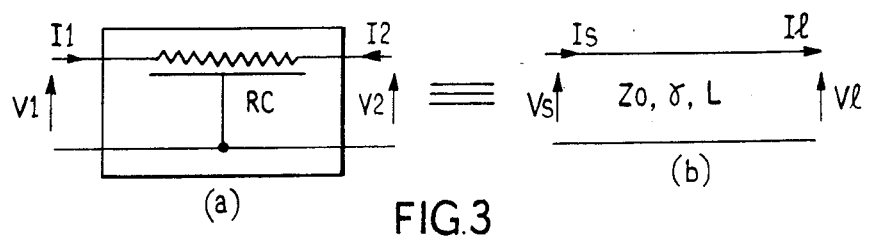
FIG. 3 shows a single distributed RC filter circuit element (a) and a length of transmission line (b)

FIG. 3a shows a single distributed RC filter element having a total distributed resistance R and a total distributed capacitance C. Input voltage and input current are V1 and I1, respectively, and output voltage and output current are V2 and I2, respectively. The filter element shown in FIG. 3a can be deemed to be entirely equivalent to the length of transmission line shown in FIG. 3b. This length L of transmission line has a characteristic impedance Zo and a complex propagation constant $\gamma$. Line input voltage and input current are Vs and Is, respectively, and line output voltage and output current are V1 and I1, respectively.

Standard transmission line equations for V1 and I1 are:

$$V1 = Vs \cdot \cosh(\gamma L) - IsZo \cdot \sinh(\gamma L) \quad (1)$$

$$I1 = -Vs/Zo \cdot \sinh(\gamma L) + Is \cdot \cosh(\gamma L) \quad (2)$$

$$\gamma = \sqrt{(Gu + sCu)(Ru + sLu)} \quad (3)$$

and $$Zo = \sqrt{\frac{Ru + s \cdot Lu}{Gu + s \cdot Cu}} \quad (4)$$

where
Lu=loop inductance per unit length of line.
Gu=shunt conductance per unit length of line.
Cu=shunt capacitance per unit length of line.
Ru=loop resistance per unit length of line.
s=jw=frequency variable.

For the filter element shown in FIG. 3a, the chain matrix definition is:

$$\begin{bmatrix} V1 \\ I1 \end{bmatrix} = \begin{bmatrix} A & B \\ C & D \end{bmatrix} \begin{bmatrix} V2 \\ -I2 \end{bmatrix} \text{ or } \begin{bmatrix} V2 \\ I2 \end{bmatrix} = \begin{bmatrix} D & B \\ C & A \end{bmatrix} \begin{bmatrix} V1 \\ -I1 \end{bmatrix} \quad (5)$$

The corresponding transmission line chain matrix definition is:

$$\begin{bmatrix} V1 \\ -I1 \end{bmatrix} = \begin{bmatrix} D & B \\ C & A \end{bmatrix} \begin{bmatrix} Vs \\ -Is \end{bmatrix} \quad (6)$$

which from equations (1) and (2) becomes:

$$\begin{bmatrix} V1 \\ -I1 \end{bmatrix} \begin{bmatrix} \cosh(\gamma L) & Zo \cdot \sinh(\gamma L) \\ 1/Zo \cdot \sinh(\gamma L) & \cosh(\gamma L) \end{bmatrix} \begin{bmatrix} Vs \\ -Is \end{bmatrix} \quad (7)$$

Thus, for the filter element chain matrix definition (5), it can be assumed that:

$$\begin{aligned} A &= D = \cosh(\gamma L) \\ B &= Zo \cdot \sinh(\gamma L) \\ C &= 1/Zo \cdot \sinh(\gamma L) \end{aligned} \quad (8)$$

For distributed resistance-capacitance: $G_n = 0$ and $L_u = 0$. As a result, equation (3) for $\gamma$ becomes:

$$\gamma = \sqrt{sRu.Cu} \quad (9)$$

and equation (4) for Zo becomes:

$$Zo = \sqrt{\frac{Ru}{sCu}} \quad (10)$$

Figure 4:
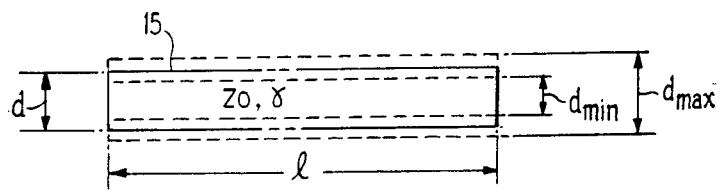
FIG. 4 shows a strip of distributed resistance-capacitance.

A strip 15 of distributed resistance-capacitance shown in FIG. 4 has a length l and a width d. Assuming the $k_c$ is the capacitance per unit square of the strip 15, then the total capacitance C of the strip is:

$$C = k_c l d \quad (11)$$

Similarly, assuming that $k_r$ is the resistivity per unit square of the strip 15, then the total resistance R of the strip is:

$$R = k_r l/d \quad (12)$$

From equation (9), $\gamma l = \sqrt{sRuCu}.l = \sqrt{sRuCu.l^2} = \sqrt{sRC}$

Therefore $$\gamma l = s.k_r l/d.k_c l d = sk_r k_c l^2 \quad (13)$$

From equation (10)

$$Zo = \sqrt{\frac{R}{sC}} \text{ so that } Zo = \sqrt{\frac{k_r}{sk_c d^2}} \quad (14)$$

The filter element chain matrix definition (5) can therefore be written as:

$$\begin{bmatrix} V1 \\ I1 \end{bmatrix} = \quad (15)$$

$$\begin{bmatrix} \cosh(\sqrt{sk_r k_c l^2}) & \sqrt{k_r/sk_c d^2} \cdot \sinh(\sqrt{sk_r k_c l^2}) \\ \overline{sk_c d^2/k_r} \cdot \sinh(\sqrt{sk_r k_c l^2}) & \cosh(\sqrt{sk_r k_c l^2}) \end{bmatrix} \begin{bmatrix} V2 \\ -I2 \end{bmatrix}$$

Also, $\gamma l = \sqrt{sk_r k_c l^2}$ can be written as $\sqrt{s\tau}$, where $\tau$ is the distributed time constant i.e. $\tau = RC$.

Figure 5:
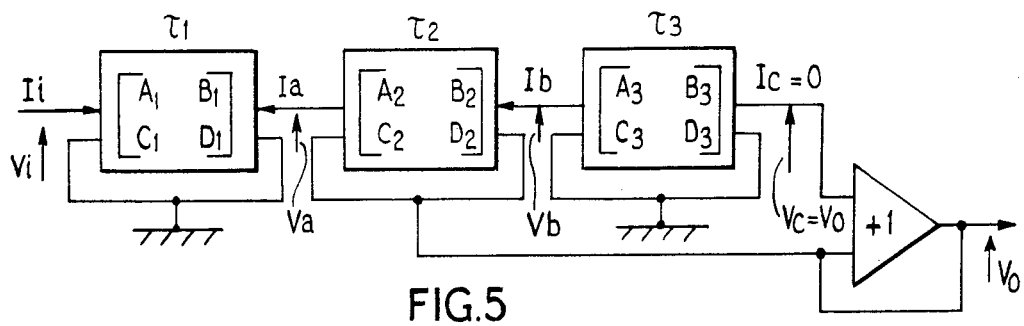
FIG. 5 illustrates in chain matrix form the transfer functions of the filter elements in the device of FIG. 2.

It can be seen from FIG. 5, that the chain matrix definitions for the RC active filter device shown in FIG. 2 are:

$$\begin{bmatrix} Vi \\ Ii \end{bmatrix} = \begin{bmatrix} A1 & B1 \\ C1 & D1 \end{bmatrix} \begin{bmatrix} Va \\ -Ia \end{bmatrix} \quad (16)$$

$$\begin{bmatrix} Va - Vo \\ -Ia \end{bmatrix} = \begin{bmatrix} A2 & B2 \\ C2 & D2 \end{bmatrix} \begin{bmatrix} Vb - Vo \\ -Ib \end{bmatrix} \quad (17)$$

$$\begin{bmatrix} Vb \\ -Ib \end{bmatrix} = \begin{bmatrix} A3 & B3 \\ C3 & D3 \end{bmatrix} \begin{bmatrix} Vo \\ 0 \end{bmatrix} \quad (18)$$

Solving equations (16) to (18) gives:

$$\frac{Vo}{Vi} = \quad (19)$$

$$\frac{1}{A1[1 + A2(A3 - 1) + B2C3] + (A3 - 1)B1C2 + D2B1C3}$$

If the width d of the strip (15) used for the filter elements is made the same for all the filter elements, it has been recognized that this transfer function (19) becomes independent of this width d. Thus, variation in the width d due to process spreading (e.g. over- or under-etching) does not alter the frequency response shape of the filter's characteristic. With d made the same for each of the 'B' and 'C' terms, and by substitution from equations (8), for which substitution L corresponds to l, and by manipulating, the transfer function Vo/Vi becomes:

$$\frac{Vo}{Vi} = \quad (20)$$

$$\frac{1}{\cosh(\sqrt{s\tau 1}) - \cosh(\sqrt{s(\tau 1 + \tau 2)}) + \cosh(\sqrt{s(\tau 1 + \tau 2 + \tau 3)})}$$

In equation (20), each $\tau$ term contains the same factor $k_r k_c$ which will vary with other process spreads as already mentioned. However, in each term of the equation (20), a $\tau$ term is multiplied by the frequency variable s, so that process spreading does not affect the shape of the frequency response characteristic but only serves to frequency translate this characteristic. Thus, process spreading only stretches or compresses the filter device's response on the frequency axis and hence the pass band ripple response of the particular filter design is preserved.

The cosh terms in equation (20) are all of the form $\cosh(\sqrt{jwx})$ which can be evaluated using the relationship:

$$\cosh\sqrt{jwx} = \cosh y. \cos y + j \sin y. \sinh y,$$

where $y = (wx)/2$.

The transfer function for the filter device can now be designed using a computer program which selects the appropriate value of strip length l for each filter element to give the desired pass-band ripple value coupled with the maximum rate of cut-off in the stop band. The final design values are obtained by frequency translating the initial design to the desired frequency range and accounting for the process spread range in the $k_r k_c$ term.

One particular implementation, using N-channel MOS integrated circuit technology, of the RC active filter device shown in FIG. 2 has been as a continuous time anti-aliasing low pass pre-filter for band limiting input signals to be applied to a switched-capacitor band pass filter. Because switched-capacitor filters are sampled-data circuits, input signals (e.g. noise) of frequencies higher than their Nyquist limit will be aliased by the sampling action. The band limiting of the input signals, which prevents this aliasing by rejecting such higher frequencies, need not be critical as regards frequency response where the sampling frequency for the band pass filter is appreciably higher than the low pass band of the anti-aliasing filter. However, it is important that the ripple response in the low pass band is kept low and this is achieved, despite process tolerances, by the design of RC active filter device described.

In the particular implementation referred to, the following design values were assumed:

Capacitance per unit area = 0.33 fF/sq.mm. ±15%

Resistance per square = 150 ±40%

Pass band amplitude ripple = 0.05 dB

Pass band = 0–5 kHz.

The following values result for the lengths of the RC filter elements if a 5 μm (ideal) strip width is assumed:

l1 = 8463 μm. gives C = 13.96pF, R = 254k l = 21063 μm. gives C = 34.75pF, R = 632k l2 = 8463 μm. gives C = 13.96pF, R0 254k As indicated in dotted lines in FIG. 4, the actual width of the strip can vary between maximum and minimum values $d_{max}$ and $d_{min}$; which can be as much as ±1 μm for the 5 μm strip width used. With the strip defining a corrugated path with rectilinear turns at the ends of adjacent parallel portions thereof, and with 5 μm gaps between the adjacent portions, the total area required for the strip is 0.38 sq.mm.

More generally, since the width of the strip does not affect the transfer function of the filter device, provided it is constant for all the filter elements, the minimum area for this width can be chosen as a minimum strip width.

Figure 6:
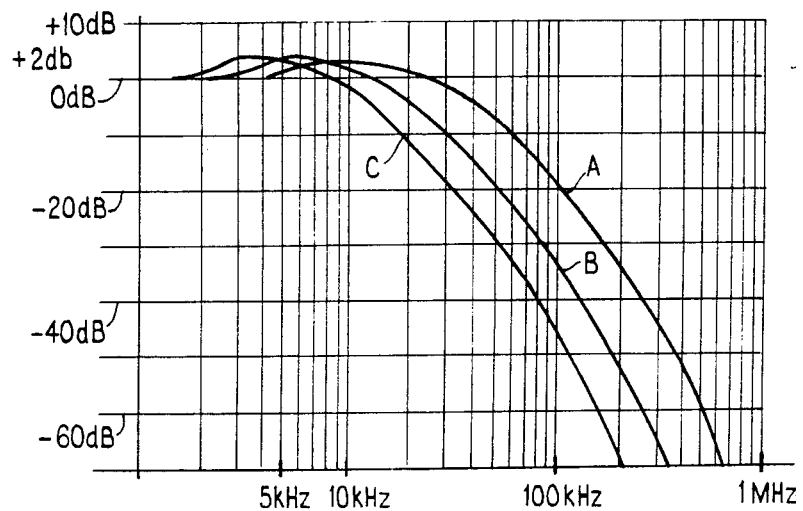
FIG. 6 is a graph showing frequency response and ripple response characteristics for a low pass RC active filter device which is implemented in the manner described.

FIG. 6 shows the frequency response and ripple response characteristics for the low pass RC active filter device of the above design. The "shape" of the frequency response is dependent only on the ratios of the lengths of the strips from which the filter elements are fabricated. Spreads in absolute R and C values only stretch or compress the response on the frequency axis. The three curves A, B and C in FIG. 6 illustrate this effect. Curve B shows a nominal response and curves A and C show worst-case response for the (same) width of strip for all the filter elements. Because the lengths of the strips are very large (compared with their width) any variation in length caused by process tolerances will be of such a small percentage of the length as to have negligible effect on the design characteristics. In each of the curves A, B and C, it can be seen that the ripple response in the low pass band is virtually the same. A 2 dB maximum ripple is shown in FIG. 6 for the purpose of illustration, but a maximum ripple as low as 0.05 dB can be obtained in practice.

Figure 10A:
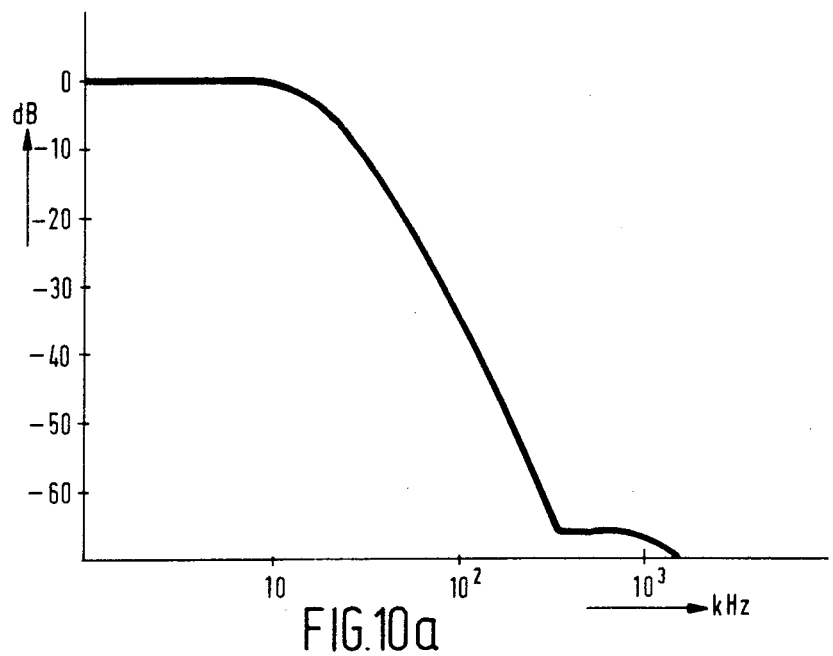
FIGS. 10a and 10b show typical frequency response graphs (i.e. frequency versus dB) for the filter device according to the invention of FIG. 2, and for the known filter device of FIG. 1, respectively.
Figure 10B:
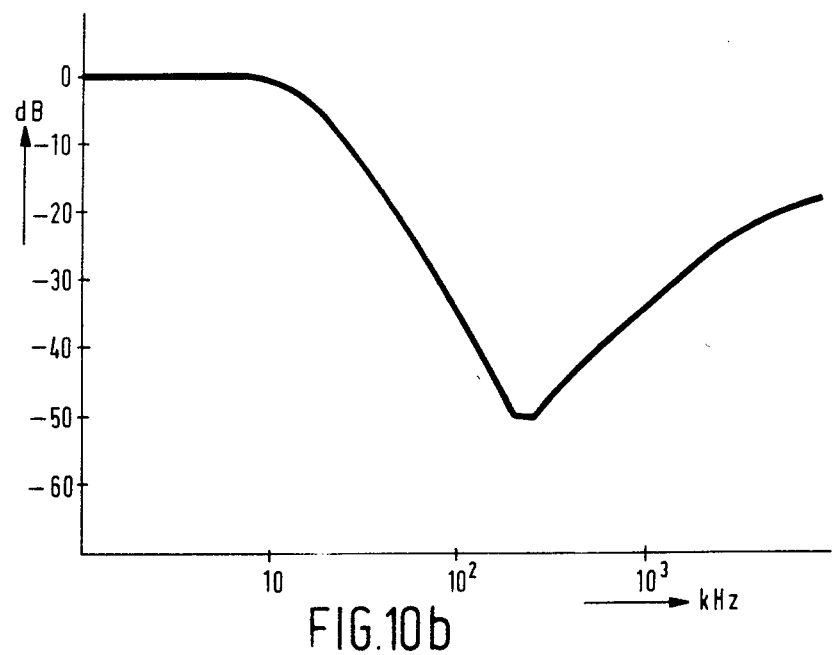

The response curve shown in FIG. 10a also relates to the filter device of FIG. 2 and is similar to that shown in FIG. 6, except that negligible ripple is shown in the pass band up to 10 KHz. Instead, FIG. 10a shows more precisely the shape of the response curve at higher frequencies approaching 1 MH and beyond. It can be seen that at these higher frequencies the filter attenuation stays below −60 dB. FIG. 10b is a corresponding response curve for the filter device of FIG. 1 which does not have the third RC filter element in accordance with the invention. Without this third RC filter element, it can be seen from FIG. 10b that breakthough of higher frequency components in the input signal results in the filter attenuation progressively decreasing with increasing frequency. Also, the maximum attenuation (−50 dB) which is attained is less when the third filter element is provided. Beyond the frequency of around 200 KHz where the maximum attenuation occurs, the attenuation decreases until it is less than −20 dB for frequency components approaching 2 MH.

Figure 7:
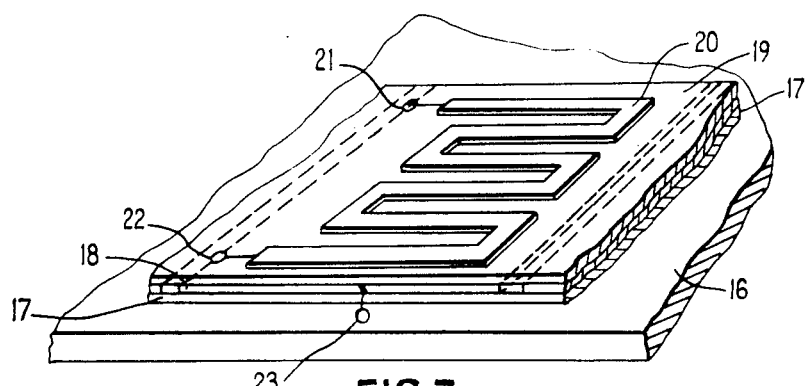
FIG. 7 shows diagrammatically one construction of a single distributed RC filter element with integrated circuit technology.

A distributed RC filter element can be fabricated in an integrated circuit as shown diagrammatically in FIG. 7. In this figure, an integrated circuit has a substrate 16. An insulating layer 17 is formed on the substrate 16 and a resistive plate 18 is provided over the insulating layer 17. A second insulating layer 19 is formed over the plate 18, and a resistive strip 20 is provided on top of the second insulating layer 19. The resistive strip 20 defines a corrugated path having rectilinear turns at the ends of adjacent parallel portions thereof. Terminal connections 21 and 22 are provided at opposite ends of the strip 20 which exhibits a finite distributed resistance between these terminals in accordance with its length, width and resistivity. The distributed shunt capacitance of the filter element is formed by the strip 20 and the plate 18, with the insulating layer 19 forming the dielectric. A common shunt capacitance terminal 23 is provided at a point on the plate 18. The filter element thus formed can be "floating" with respect to the substrate potential.

Figure 8:
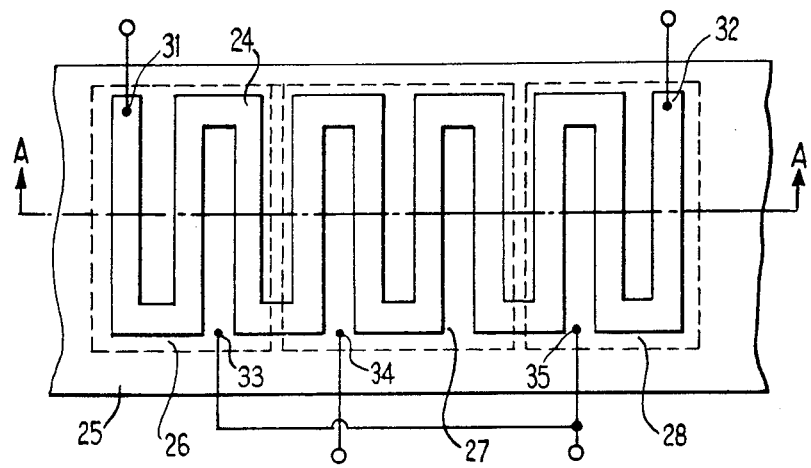
FIGS. 8 and 9 show diagrammatically the construction of three distributed RC filter elements with integrated circuit technology, having merged resistive elements.
Figure 9:
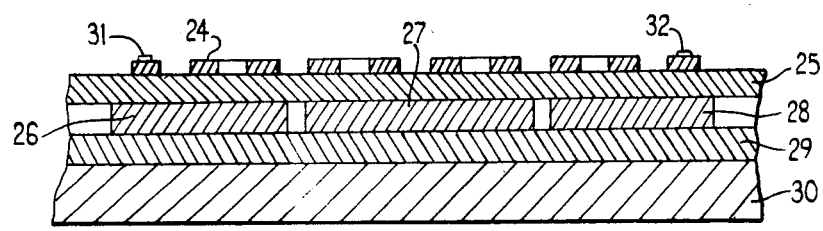

As fabricated in an N-channel MOS integrated circuit, three series-connected filter elements can be formed as shown in FIGS. 8 and 9. FIG. 8 is a plan view of a fragmentary portion of an integrated circuit, and FIG. 9 is a sectional view taken through the line A—A in FIG. 8. A strip 24 of polycrystalline silicon is formed on an oxide insulating layer 25 which is formed over three plates 26, 27 and 28 of polycrystalline silicon. These three plates 26 to 28 are, in turn, formed on an oxide insulating layer 29 which is formed on a silicon substrate 30. The strip 24 has a meandering or corrugated path which extends over the plates 26 to 28 which are mutually insulated from each other. Each of these plates and the portion of the strip which extends over it forms, with the intervening insulating layer 25, a uniformly distributed series resistance and a uniformly distributed shunt capacitance. The distributed series resistance of the three filter elements are merged together by virtue of the strip 24 being continuous between access connections 31 and 32. The plates 26, 27 and 28 have respective access connections 33, 34 and 35.

I claim:

1. An analog wave filter device comprising an active device and first and second RC filter elements each providing a series resistance and a shunt capacitance, each filter element having first and second connection points between which its series resistance is defined and a third connection point for the shunt capacitance, the first connection point of the first filter element serving as an input of the filter device, the second connection point of the first filter element being connected to the first connection point of the second filter element, the second connection point of the second filter element being connected to an input of the active device, the third connection point of the first filter element being connected to an output of the active device, and the third connection point of the second filter element being connected to ground, which filter device has an integrated operational amplifier as its active device and has its first and second RC filter elements in integrated distributed form, and which filter device is characterized by comprising a third RC filter element which is of the same distributed form as the first and second filter elements and which has its second connection point connected to the first connection point of the first filter element and its third connection point connected to ground, the first connection point of the third filter element forming the input of the filter device.

2. An analog wave filter device as claimed in claim 1, characterized in that each filter element is fabricated as a strip of resistive material on a layer of insulating material which overlies a plate of resistive material, which latter is insulated from a substrate by a further layer of insulating material on said substrate.

3. An analog wave filter device as claimed in claim 2, characterized in that the strips of resistive material for the filter elements are merged together to form a continuous strip of resistive material, distributed shunt capacitances for the filter elements being defined by respective plates and the respective portions of the strip of resistive material which overlie them.

4. An analog wave filter device as claimed in claim 2 or claim 3, characterized in that said strip is formed to define a corrugated path having rectilinear turns at the ends of adjacent parallel portions thereof.

5. An analog wave filter device as claimed in claim 2 or claim 3, fabricated as an N-channel MOS integrated circuit.

* * * * *